United States Patent [19]

Kim

[11] Patent Number: 5,903,030
[45] Date of Patent: *May 11, 1999

[54] SEMICONDUCTOR DEVICE PROVIDED WITH AN ESD PROTECTION CIRCUIT

[75] Inventor: Dae Young Kim, Kyoungki-do, Rep. of Korea

[73] Assignee: Hyundai Electronics Industries Co., Ltd., Kyoungki-do, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 08/871,845

[22] Filed: Jun. 9, 1997

[30] Foreign Application Priority Data

Jun. 24, 1996 [KR] Rep. of Korea .................... 96-23263

[51] Int. Cl.$^6$ ................................... H01L 23/62
[52] U.S. Cl. .................... 257/355; 257/358; 257/360; 257/356
[58] Field of Search ................... 257/355, 358, 257/360, 356, 173, 174, 297, 328, 363, 357

[56] References Cited

U.S. PATENT DOCUMENTS 5,270,565  12/1993  Lee et al. ................... 257/355
5,365,103  11/1994  Brown et al. .
5,378,906  1/1995   Lee .
5,451,799  9/1995   Kurimoto et al. ............ 257/174
5,623,156  4/1997   Watt ........................... 257/355
5,789,791  8/1998   Bergemont .................. 257/365

FOREIGN PATENT DOCUMENTS 6-084 941   3/1994   Japan .
6-318 674   11/1994  Japan .
WO 91/05371 4/1991   WIPO .

*Primary Examiner*—Carl Whitehead, Jr.
*Attorney, Agent, or Firm*—Thelen Reid & Priest, LLP

[57] ABSTRACT

A semiconductor device provided with an ESD circuit including an active region defined on a semiconductor substrate, the active region having a plurality of uniformly spaced protrusions extending from upper and lower ends thereof, a plurality of contact regions defined on the semiconductor substrate within each protrusion of the active region, and a plurality of uniformly spaced gates formed on the semiconductor substrate in portions of the active region except for the protrusions while extending in the same directions, respectively, each gate being arranged between adjacent protrusions while being spaced from the protrusions. It is possible to obtain a maximum space between the contact regions and associated gates overlapping the active region by forming protrusions extending from the upper and lower ends of the active region and forming the contact regions on the protrusions. Accordingly, the area of the active region is greatly reduced.

14 Claims, 2 Drawing Sheets

SEMICONDUCTOR DEVICE PROVIDED WITH AN ESD PROTECTION CIRCUIT

BACKGROUND OF THE INVENTION

1. Field of the Invention

The present invention relates to a semiconductor device provided with an ESD circuit, and more particularly to a semiconductor device provided with an ESD circuit which is structured to achieve a high integration of the semiconductor device.

2. Description of the Prior Art

Semiconductor devices may be exposed to high voltage for various reasons. Where a semiconductor device, in particular, a MOS device, is exposed to high voltage, a gate break phenomenon or a junction spiking phenomenon may occur, thereby resulting in a complete break of the device. Although the device itself may only be slightly damaged due to the exposure to high voltage, its reliability is greatly reduced.

In order to avoid such a problem, a high voltage electrostatic discharge (ESD) circuit has recently been proposed.

The ESD circuit should have a space of 5 μm or more between the gate of its data input/output pull-up/down transistor and its contact arranged adjacent to the gate.

Such an ESD circuit will now be described in conjunction with FIG. 1.

FIG. 1 illustrates the layout of a conventional ESD circuit fabricated on a semiconductor substrate.

As shown in FIG. 1, the ESD circuit includes an active region 1 defined on a semiconductor substrate (not shown). Although not shown, data input/output pull-up/down transistors are formed on a portion of the semiconductor substrate corresponding to the active region 1. A plurality of uniformly spaced contact regions 2 are also defined on the semiconductor substrate within the active region 1. The contact regions 2 are arranged in spaced lines.

Gates 3 of the transistors are also formed on portions of the semiconductor substrate between adjacent lines of the contact regions 2 within the active region 1. That is, the gates 3 are arranged in an alternating manner with respect to the contact regions 2.

As mentioned above, the space between adjacent gate 3 and contact region 2 should be 5 ∥m or more. Due to such a space, the elements 2 and 3 occupy a large portion of the semiconductor substrate. In other words, the conventional ESD circuit has a large area where its layout is designed in such a manner that the space of the gate and contact overlapping the active region is 5 μm or more. As a result, problem arises because the chip size increases.

SUMMARY OF THE INVENTION

An objective of the invention is to solve the above-mentioned problem involved in the prior art and to provide a semiconductor device provided with an ESD circuit capable of minimizing the area of the ESD circuit occupied in the semiconductor device.

Another objective of the invention is to provide a semiconductor device provided with an ESD circuit, which is structured to achieve a high integration of the semiconductor device.

In accordance with an aspect of the present invention, these objects are accomplished by providing a semiconductor device provided with an ESD circuit, comprising: a semiconductor substrate; an active region defined on the semiconductor substrate, the active region having a plurality of uniformly spaced protrusions extending from at least one end thereof; at least one contact region defined on the semiconductor substrate within each protrusion of the active region; and a plurality of uniformly spaced gates formed on the semiconductor substrate in portions of the active region except for the protrusions while extending in the same directions, respectively, each gate being arranged between adjacent protrusions while being spaced from the protrusions.

In accordance with an aspect of the present invention, a semiconductor device provided with an ESD circuit, comprising:

a semiconductor substrate; an active region defined on the semiconductor substrate, the active region having a plurality of uniformly spaced protrusions extending from upper and lower ends thereof; a plurality of data input/output pull-up/down transistors for the ESD circuit formed on the semiconductor substrate in the active region; a plurality of contact regions defined on the semiconductor substrate within each protrusion of the active region; and a plurality of uniformly spaced gates formed on the semiconductor substrate in portions of the active region except for the protrusions while extending in the same directions, respectively, each gate being arranged between adjacent protrusions while being spaced from the protrusions.

In accordance with an aspect of the present invention, a semiconductor device provided with an ESD circuit, comprising:

a semiconductor substrate; an active region defined on the semiconductor substrate, the active region having a plurality of uniformly spaced protrusions extending from one of upper and lower ends thereof; a plurality of data input/output pull-up/down transistors for the ESD circuit formed on the semiconductor substrate in the active region; at least one contact region defined on the semiconductor substrate within each protrusion of the active region; and a plurality of uniformly spaced gates formed on the semiconductor substrate in portions of the active region except for the protrusions while extending in the same directions, respectively, each gate being arranged between adjacent protrusions while being spaced from the protrusions.

BRIEF DESCRIPTION OF THE DRAWINGS

Other objectives and aspects of the invention will become apparent from the following description of embodiments with reference to the accompanying drawings in which.

DETAILED DESCRIPTION OF THE PREFERRED EMBODIMENTS

Figure 1:
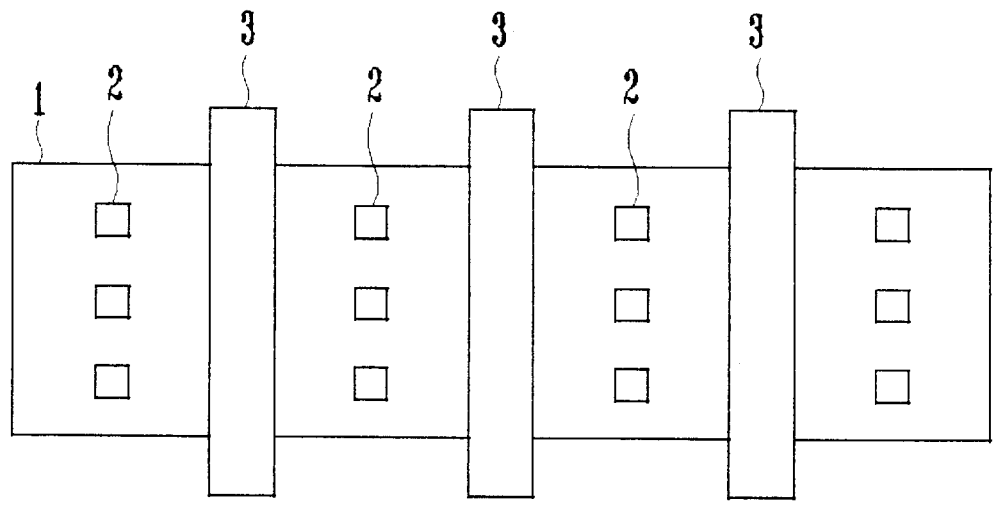
FIG. 1 is a plane view illustrating the layout of a conventional ESD circuit fabricated on a semiconductor substrate.
Figure 2:
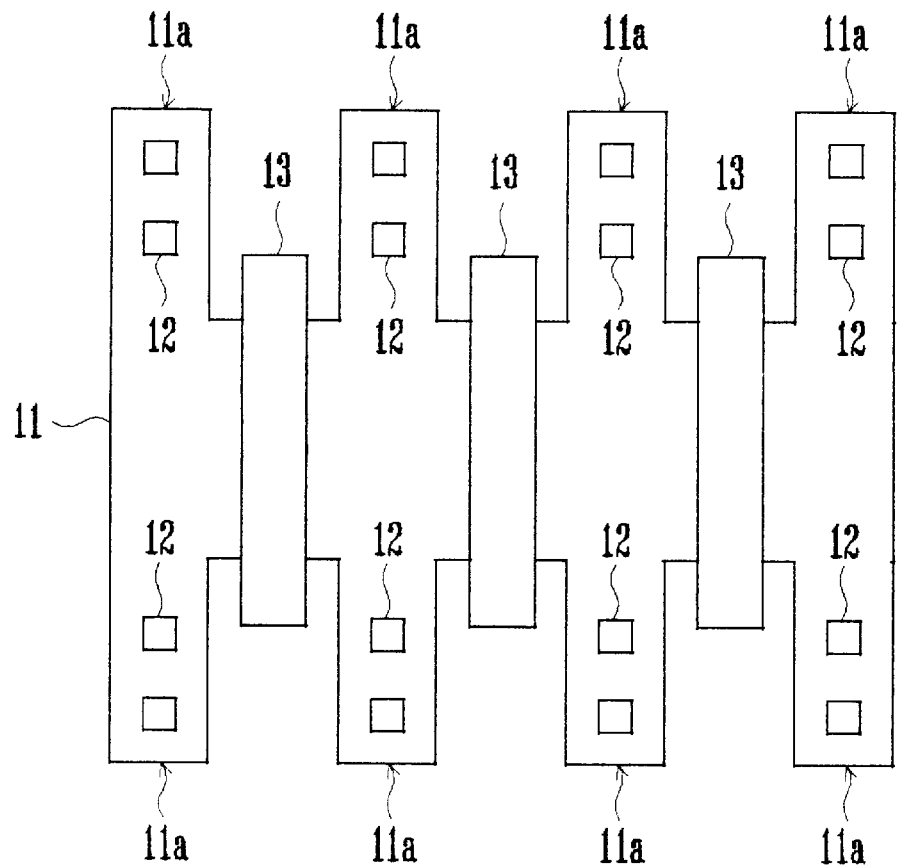
FIG. 2 is a plane view illustrating the layout of an ESD circuit fabricated on a semiconductor substrate in accordance with an embodiment of the present invention.

FIG. 2 illustrates the layout of an ESD circuit fabricated on a semiconductor substrate in accordance with an embodiment of the present invention.

As shown in FIG. 2, the ESD circuit includes an active region 11 defined on a semiconductor substrate (not shown).

Although not shown, data input/output pull-up/down transistors are formed on a portion of the semiconductor substrate corresponding to the active region 11.

The active region 11 has a plurality of uniformly spaced extension portions 11a at its upper and lower ends.

A plurality of uniformly spaced contact regions 12 are also defined on the semiconductor substrate within each extension portion 11a of the active region 11.

Gates 13 of the transistors are also formed on portions of the semiconductor substrate respectively corresponding to portions of the active region 11 which have no extension portion. The gates 13 are arranged in such a manner that they extend in the same direction. Each gate 13 is arranged between adjacent extension portions 11a where the contact regions 12 are formed.

Although the active region 11 has a square or rectangular shape having upper and lower protrusions in the illustrated case, it may have a structure including a plurality of elongated separate active region portions where the contact regions 12 are formed.

The contact regions 12 are arranged on portions of the active region 11 spaced far away from the portions of the active region 11 overlapping the gates 13, respectively.

By virtue of such an arrangement capable of providing a sufficient space between the contact regions 12 and gates 13, it is possible to prevent the device from being damaged or broken due to a punch-through phenomenon occurring in the pull-up/down transistors.

Figure 3:
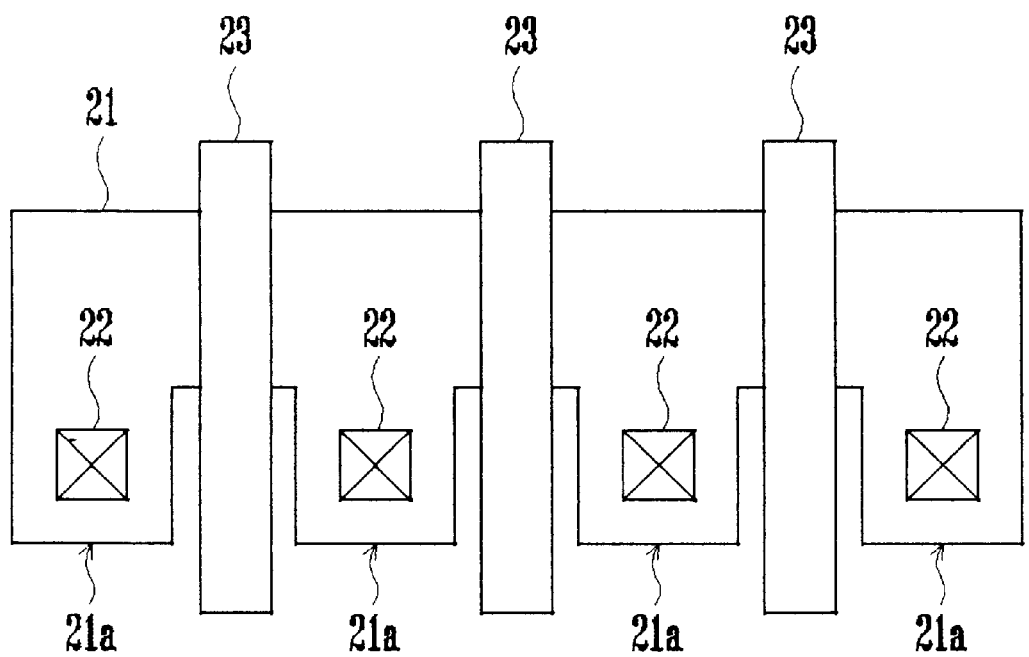
FIG. 3 is a plane view illustrating the layout of an ESD circuit fabricated on a semiconductor substrate in accordance with another embodiment of the present invention.

FIG. 3 illustrates the layout of an ESD circuit fabricated on a semiconductor substrate in accordance with another embodiment of the present invention.

As shown in FIG. 3, the ESD circuit includes an active region 21 defined on a semiconductor substrate.(not shown). Although not shown, data input/output pull-up/down transistors are formed on a portion of the semiconductor substrate corresponding to the active region 21.

The active region 21 has a plurality of uniformly spaced extension portions 21a at its upper or lower end.

At least one contact region 22 is also defined on the semiconductor substrate within each extension portion 21a of the active region 21.

Gates 23 of the transistors are also formed on portions of the semiconductor substrate respectively corresponding to portions of the active region 21 which have no extension portion. The gates 23 are arranged in such a manner that they extend in the same direction. Each gate 23 is arranged between adjacent extension portions 21a.

Although the active region 21 has a square or rectangular shape having upper and lower protrusions in the illustrated case, it may have a structure including a plurality of elongated separate active region portions where the contact regions 22 are formed.

The contact regions 22 are arranged on portions of the active region 21 spaced a substantial distance away from the portions of the active region 21 overlapping the gates 23, respectively.

By virtue of such an arrangement capable of providing a sufficient space between the contact regions 22 and gates 23, it is possible to prevent the device from being damaged or broken due to a punch-through phenomenon occurring in the pull-up/down transistors.

As is apparent from the above description, the semiconductor device provided with the ESD circuit according to the present invention has various effects.

That is, it is possible to obtain a maximum space between the contact regions and associated gates overlapping the active region by forming protrusions extending from the upper and lower ends of the active region and forming the contact regions on the protrusions. Accordingly, the area of the active region is greatly reduced, thereby achieving a high integration of the semiconductor device provided with the ESD circuit. Although the active region has been described as having a square or rectangular shape having upper and lower protrusions, it may have other shapes in so far as it includes protrusions where the metal contract regions are formed.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor device provided with an ESD circuit, comprising:
   a semiconductor substrate;
   an active region defined on the semiconductor substrate, the active region having a plurality of uniformly spaced protrusions extending from at least one end thereof;
   at least one contact region defined on the semiconductor substrate within each protrusion of the active region; and
   a plurality of uniformly spaced gates formed on the semiconductor substrate in portions of the active region except for the protrusions while extending in the same directions, respectively, each gate being arranged between adjacent protrusions while being spaced from the protrusions.

2. The semiconductor device in accordance with claim 1, further comprising a plurality of data input/output pull-up/down transistors for the ESD circuit formed on the semiconductor substrate in the active region.

3. The semiconductor device in accordance with claim 1, wherein each gate has a space of about 5 μm from each contact region arranged adjacent thereto.

4. The semiconductor device in accordance with claim 1, wherein a plurality of uniformly spaced contact regions are formed in each protrusion.

5. The semiconductor device in accordance with claim 1, wherein the active region has a plurality of uniformly spaced protrusions extending from upper and lower ends thereof.

6. The semiconductor device in accordance with claim 5, wherein each gate has a space of about 5 μm from each contact region arranged adjacent thereto.

7. The semiconductor device in accordance with claim 5, wherein a plurality of uniformly spaced contact regions are formed in each protrusion.

8. The semiconductor device in accordance with claim 1, wherein the active region has a plurality of uniformly spaced protrusions extending from one of upper and lower ends thereof.

9. The semiconductor device in accordance with claim 8, wherein each gate has a space of about 5 μm from each contact region arranged adjacent thereto.

10. The semiconductor device in accordance with claim 8, wherein a single contact region is formed in each protrusion.

11. A semiconductor device provided with an ESD circuit, comprising:
    a semiconductor substrate;
    an active region defined on the semiconductor substrate, the active region having a plurality of uniformly spaced protrusions extending from upper and lower ends thereof;

a plurality of data input/output pull-up/down transistors for the ESD circuit formed on the semiconductor substrate in the active region;

a plurality of contact regions defined on the semiconductor substrate within each protrusion of the active region; and a plurality of uniformly spaced gates formed on the semiconductor substrate in portions of the active region except for the protrusions while extending in the same directions, respectively, each gate being arranged between adjacent protrusions while being spaced from the protrusions.

12. The semiconductor device in accordance with claim 11, wherein each gate has a space of about 5 $\mu$m from each contact region arranged adjacent thereto.

13. A semiconductor device provided with an ESD circuit, comprising:

a semiconductor substrate;

an active region defined on the semiconductor substrate, the active region having a plurality of uniformly spaced protrusions extending from one of upper and lower ends thereof;

a plurality of data input/output pull-up/down transistors for the ESD circuit formed on the semiconductor substrate in the active region;

at least one contact region defined on the semiconductor substrate within each protrusion of the active region; and a plurality of uniformly spaced gates formed on the semiconductor substrate in portions of the active region except for the protrusions while extending in the same directions, respectively, each gate being arranged between adjacent protrusions while being spaced from the protrusions.

14. The semiconductor device in accordance with claim 13, wherein each gate has a space of about 5 $\mu$m from each contact region arranged adjacent thereto.

* * * * *